(12) United States Patent
Fischer et al.

(10) Patent No.: US 7,977,123 B2
(45) Date of Patent: Jul. 12, 2011

(54) ARRANGEMENTS AND METHODS FOR IMPROVING BEVEL ETCH REPEATABILITY AMONG SUBSTRATES

(75) Inventors: Andreas Fischer, Castro Valley, CA (US); Neungho Shin, San Ramon, CA (US); Fransisco Camargo, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 131 days.

(21) Appl. No.: 12/471,297

(22) Filed: May 22, 2009

(65) Prior Publication Data

US 2010/0297788 A1 Nov. 25, 2010

(51) Int. Cl.
*H01L 21/66* (2006.01)
(52) U.S. Cl. .............................. 438/16; 438/7
(58) Field of Classification Search .................. 438/16, 438/14, 7; 257/171, 586
See application file for complete search history.

(56) References Cited

U.S. PATENT DOCUMENTS

| | | | |
|---|---|---|---|
| 5,807,761 A | 9/1998 | Coronel et al. | |
| 5,862,057 A | 1/1999 | Xia et al. | |
| 7,182,821 B2 * | 2/2007 | Izumi et al. | 134/36 |
| 7,479,236 B2 | 1/2009 | Chen et al. | |
| 7,486,878 B2 | 2/2009 | Chen et al. | |
| 2006/0141795 A1 | 6/2006 | Negishi et al. | |
| 2006/0185792 A1 * | 8/2006 | Yashiki et al. | 156/345.17 |
| 2007/0209684 A1 | 9/2007 | Chen et al. | |
| 2007/0211241 A1 | 9/2007 | Aizawa et al. | |
| 2007/0251919 A1 * | 11/2007 | Imai | 216/58 |
| 2008/0003830 A1 * | 1/2008 | Qing et al. | 438/694 |
| 2008/0080845 A1 | 4/2008 | Chen et al. | |
| 2008/0081383 A1 | 4/2008 | Chen et al. | |
| 2009/0233394 A1 * | 9/2009 | Batres et al. | 438/43 |
| 2009/0272402 A1 * | 11/2009 | Kim et al. | 134/1.2 |

OTHER PUBLICATIONS

"International Search Report", Issued in PCT Application No. PCT/US07/78576; Mailing Date: Aug. 7, 2008.
"Written Opinion", Issued in PCT Application No. PCT/US07/78576: Mailing Date: Aug. 7, 2008.
"International Search Report", Issued in PCT Application No. PCT/US07/78578: Mailing Date: Aug. 8, 2008.
"Written Opinion", Issued in PCT Application No. PCT/US07/78578; Mailing Date: Aug. 8, 2008.
"International Preliminary Report on Patentability", Issued in PCT Application No. PCT/US2007/078576; Mailing Date: Apr. 9, 2009.
"International Preliminary Report on Patentability", Issued in PCT Application No. PCT/US2007/078578; Mailing Date: Apr. 9, 2009.
"*Ex Parte Quayle* Action", U.S. Appl. No. 11/612,370, Mailing Date: May 29, 2008.

(Continued)

*Primary Examiner* — Thao P. Le
(74) *Attorney, Agent, or Firm* — IP Strategy Group, P.C.

(57) ABSTRACT

A method, performed in connection with bevel etching of a substrate, for improving bevel-etch repeatability among substrates, is disclosed. The method includes providing an optical arrangement and ascertaining at least one bevel edge characteristic of a bevel edge of said substrate. The method also includes deriving at least one compensation factor from said at least one bevel edge characteristic, said at least one compensation factor pertaining to an adjustment in a bevel etch process parameter. The method further includes performing said bevel etching utilizing said at least one compensation factor.

20 Claims, 7 Drawing Sheets

OTHER PUBLICATIONS

Chen et al, "Offset Correction Methods and Arrangement for Positioning and Inspecting", U.S. Appl. No. 11/612,370, filed Dec. 18, 2006.

Chen et al, "Offset Correction Techniques for Positioning Substrates", U.S. Appl. No. 11/612,355, filed Dec. 18, 2006.

Chen et al, "Offset Correction Techniques for Positioning Substrates", U.S. Appl. No. 60/827,671, filed Sep. 29, 2006.

Chen et al, "Offset Correction Techniques for Positioning Substrates", U.S. Appl. No. 60/827,671, filed Sep. 29, 2006.

"First Office Action", CN Application No. 200780036424.1; Mailing Date: Jun. 17, 2010.

"First Office Action", CN Application No. 200780036424.1; Mailing Date: Jun. 17, 2010.

\* cited by examiner

ARRANGEMENTS AND METHODS FOR IMPROVING BEVEL ETCH REPEATABILITY AMONG SUBSTRATES

BACKGROUND OF THE INVENTION

In the manufacture of semiconductor products, substrates (e.g., semiconductor wafers) are processed by successively depositing, etching, and polishing various layers to create semiconductor devices. Plasmas and more specifically plasma-enhanced etching and deposition have often been employed in these processing steps.

Generally speaking, process engineers strive to employ as much of the available area on a substrate as possible to fabricate the semiconductor devices. Due to process limitations and other factors, there is often a ring-shaped region at the outer edge of the substrate where device formation is not deemed reliable and therefore not often attempted. Since processing tends to be focused on the interior region of the substrate, particulate deposition of organic and inorganic materials often builds up in the vicinity of the aforementioned ring-shaped edge region. If the deposition is not removed through successive processing steps, some of the deposited material may flake off and contaminate the plasma processing chamber and/or the interior region of the substrate itself. Such contamination often leads to lower device yield for the substrate and may be as high as several percent.

To reduce and/or minimize the possibility that the deposited material in this ring-shaped edge region could flake off and lower device yield, process engineers have interleaved one or more bevel etch steps in between device-forming processing steps. In a typical bevel etch step, the device-forming region of the substrate is not processed with plasma. Rather, a bevel etch apparatus is employed to form a ring-shaped plasma near the periphery of the substrate to etch away some of the accumulated material at the substrate's outer edge. By interleaving one or more bevel etch steps into the device manufacturing process, undue built-up of accumulated deposition in the aforementioned ring-shaped edge region is inhibited. Accordingly, the possibility that some of the accumulated deposition in the ring-shaped edge region of the substrate may flake off is substantially reduced, leading to improved device yield.

As with most technology areas surrounding the manufacture of semiconductor products, constant innovation and improvement in the field of bevel etching is required to adapt to increasingly smaller etch feature sizes and larger substrates, which tend to place stringent demands on etch process windows. Improving the bevel etching process in the manufacture of semiconductor devices is one of the goals of the present invention.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Figure 1B:
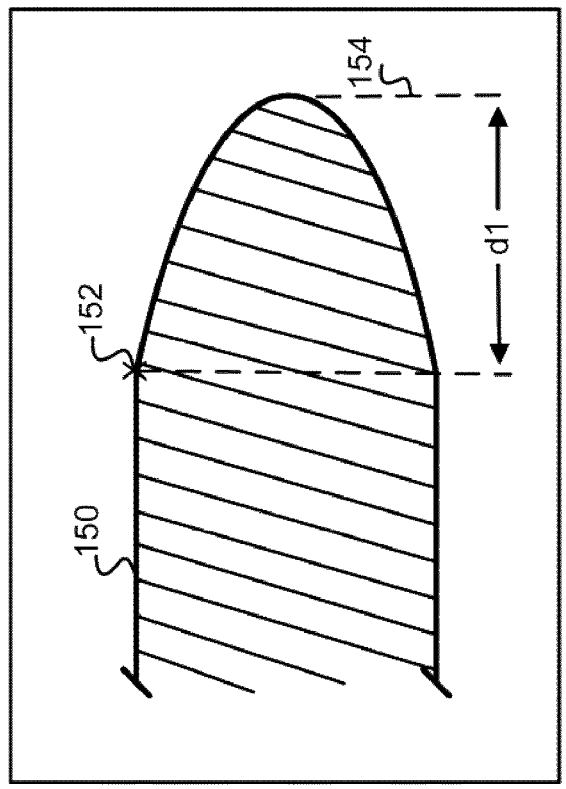
FIGS. 1A and 1B show example substrate bevel edge profiles.
Figure 1A:
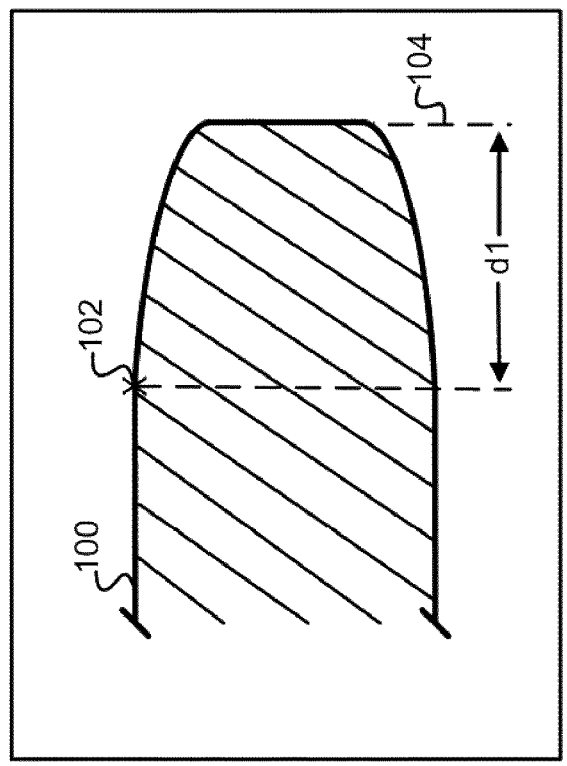

Embodiments of the invention relate to methods and apparatus for improving bevel etch repeatability among substrates irrespective of the degree of variation of the pre-bevel etch substrates. In an aspect of the invention, the inventor herein realizes that a factor tending to complicate attempts to improve bevel etch repeatability relates to the fact that the pre-bevel etch substrates may have differences with respect to the profile of the bevel edge. With reference to FIGS. 1A and FIG. 1B, for example, substrate 100 can be seen to have a more square-shaped bevel edge profile relative to the bevel edge profile of substrate 150, which appears more tapered toward the edge.

If the bevel etch recipe is kept the same when bevel etching is performed on substrate 100 and substrate 150, the bevel etch rate al location 102, which is located a distance d1 away from edge 104 would be less than the bevel etch rate at location 152, which is also located a distance d1 away from edge 154. This is because the ring-shaped or donut-shaped plasma cloud or its reactive by-products that surround the outer edge of substrate 100 would be less able to penetrate toward the center of substrate 100 compared to the situation with substrate 150. Consequently, less deposited material is etched or removed from location 102 of substrate 100 compared to the amount of deposited material removed from location 152 of substrate 150.

One of the challenges in performing bevel etching has to do with bevel etch distance repeatability. Customers require that during the bevel etch, removal rates of films deposited at the outer edges of the substrates (the bevel) are within a certain range tool-to-tool as well as wafer-to-wafer or, in other words, conform to a certain repeatability criteria. For example, some customers may require that all films are to be cleared up to a certain distance, the bevel etch distance, from the wafer apex within a certain variability range tool-to-tool or wafer-to-wafer. Bevel etch distance repeatability refers to the notion that after bevel etching, the post-bevel etch substrates should have substantially the same bevel etch distance for a given tool.

Thus, if all other bevel etch recipe parameters are unchanged from substrate to substrate, the post-bevel etch result for substrate 100 will show less material removal at point 102 or substrate 100 compared to amount of material removed at point 152 of substrate 150.

In one or more embodiments of the invention, an optical arrangement is provided to characterize the bevel edge profile and/or thickness of a substrate. The bevel edge characteristics are then analyzed using software and/or hardware in a logic module in order to derive feed-forward information to adjust process parameters. The process parameters are adjusted using the feed-forward information in order to compensate for the pre-bevel etch variation from substrate to substrate. With proper process parameter adjustments, improved bevel etch repeatability may be obtained.

In one or more embodiments, an optical arrangement including one or more light sources and sensors is employed to ascertain the bevel edge variations (including variations in bevel edge shapes and/or sizes) among substrates. The bevel edge variations may then be employed to ascertain the feed-forward correction parameters to ensure repeatability in the bevel etch result from substrate to substrate. The correction parameters include, for example, changing the bevel etch time, bevel etch chemistry, electrode gap, RF power level, pressure, etc.

In an embodiment, the optical arrangement includes a camera that is positioned co-planarly with the substrate and directed tangentially at the substrate's bevel edge in order to capture an image of the side profile of the substrate bevel edge. This image capture may be performed as part of the pre-bevel etch preparation, for example. If desired, the substrate bevel edge may be illuminated with a suitable light source, such as an LED module or some other light source. The bevel edge side profile is then analyzed to ascertain the feed-forward correction parameters to ensure bevel etch repeatability from substrate to substrate.

In one or more embodiments, the optical arrangement includes a mirror positioned so as to allow a camera positioned above the substrate, co-planar with the substrate, or in a position other than co-planar with the substrate to capture an image of the side profile of the substrate bevel edge. In some systems, a camera may be present to assist in the alignment of the substrate with the processing center of the chamber and/or to calibrate the robot arm. With the addition of one or more mirrors, the same camera may be employed to capture a side profile image of the bevel edge to ascertain the feed-forward correction parameters to ensure bevel etch repeatability from substrate to substrate.

In one or more embodiments, the optical arrangement includes an optical fiber to illuminate the substrate bevel edge from a remote light source and/or an optical fiber to capture an image of the side profile of the bevel edge from a remote camera. The use of one or more optical fibers in this manner eliminates the line-of-sight requirement in positioning the sensor (e.g., the camera) and/or the illuminating light source.

In one or more embodiments, the optical arrangement includes a laser light source and an array of sensors positioned to receive the reflected beam as the laser beam is bounced off the bevel edge. Depending on the degree of taper at the point of beam incidence, the reflected beam strikes a specific sensor in the array of sensors. By ascertaining the sensor being activated and deducing the beam's reflection angle, information about the bevel edge taper angle at the point of beam incidence may be obtained. Such information about the bevel edge taper may then be employed to ascertain the feed-forward correction parameters to ensure bevel etch repeatability from substrate to substrate.

Other optical arrangements for ascertaining the bevel edge variations among substrates may be employed and the claimed invention, as governed by the claims, is not limited to any particular example discussed herein. For example, two or more lasers of different colors and/or different polarization angles may be employed to ascertain bevel edge taper, in one or more embodiments.

Figure 2:
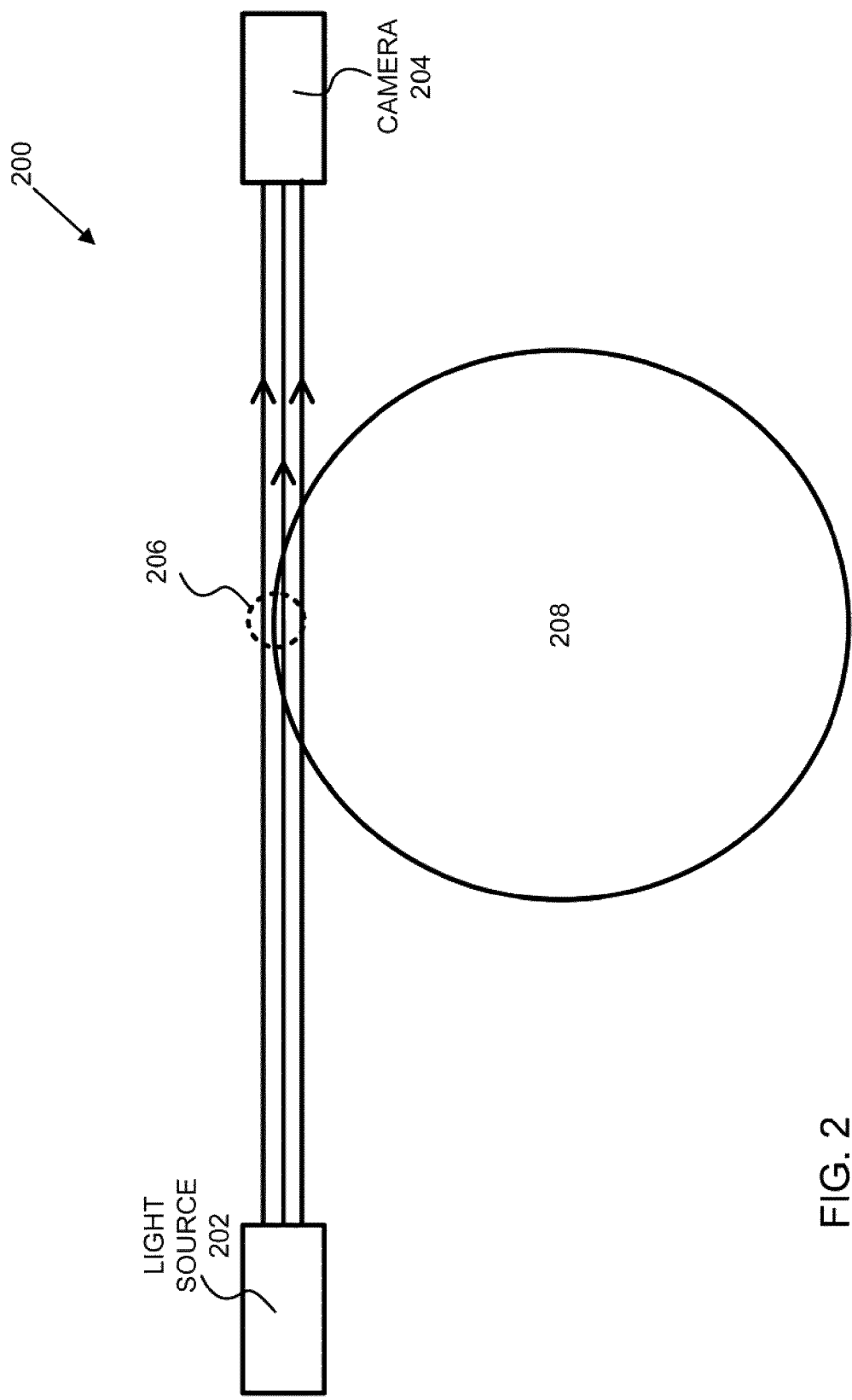
FIG. 2 shows, in accordance with an embodiment of the invention, a bevel edge profile detection arrangement.

The features and advantages of embodiments of the invention may be better understood with reference to the figures and discussions that follow. FIG. 2 shows, in accordance with one or more embodiments, a top view of a bevel edge detection arrangement 200 including an optional light source 202 and a camera 204 as shown. Light source 202 is positioned to illuminate the bevel edge 206 of substrate 208 to allow co-planar camera 204 to capture the side profile of the bevel edge, such as that shown in FIG. 1A or FIG. 1B. Co-planar camera 204 is pointed tangentially at the outer edge of the substrate to enable camera 204 to capture the side profile of the bevel edge. The side profile is then analyzed by software and/or hardware of a logic module (not shown) to ascertain the feed-forward compensation factors.

Figure 3B:
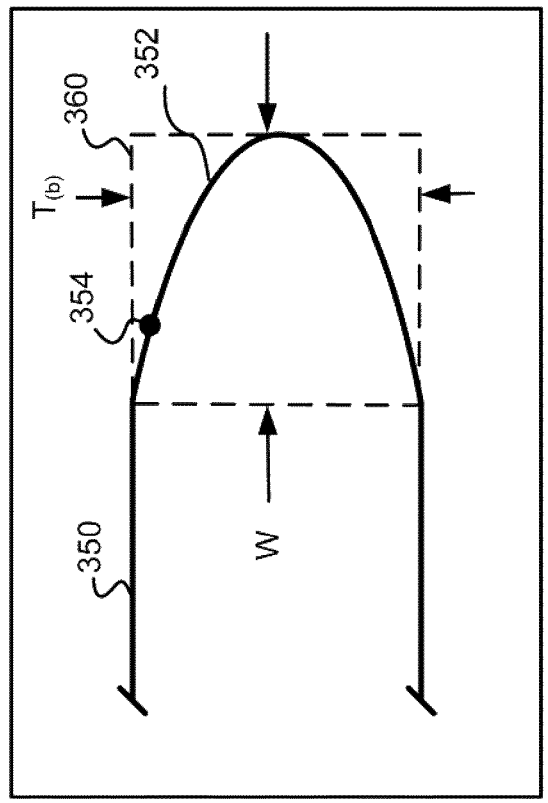
FIGS. 3A and 3B show, in accordance with one or more embodiments of the invention, a characterizing technique for characterizing the side profile of a substrate bevel edge.
Figure 3A:
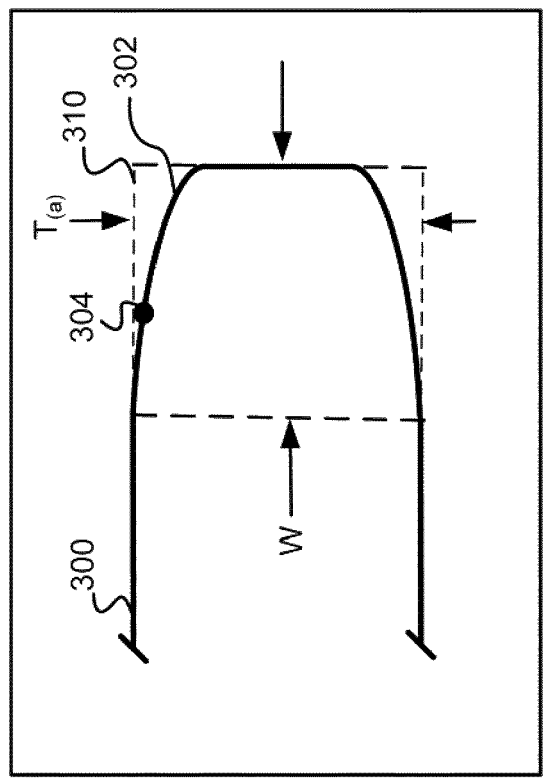

FIGS. 3A and 3B show, in accordance with one or more embodiments of the invention, a simple characterizing method for determining the required feed-forward correction parameters in order to improve bevel etch repeatability from substrate to substrate. In FIG. 3A and FIG. 3B, side profile images of two bevel edges 302 and 352 of two different substrates 300 and 350 are shown. A pattern recognition software is employed to discriminate the substrate area from the non-substrate area. The image is further processed by ascertaining a rectangular frame of a known width W from the extreme outer edge of the substrate and a thickness T of the substrate determined at the distance W from the extreme outer edge of the substrate. With respect to FIG. 3A, rectangular frame 310 is shown having a width W and a thickness T(a). In FIG. 3B, rectangular frame 360 is shown having a width W and a thickness T(b).

A fill factor is then determined for bevel edge 302. The fill factor (FF) is calculated as a ratio of the substrate area ($A_{(substrate)}$) within the rectangular frame 310 divided by the total area of the rectangular frame 310 ($A_{(frame)}$). Similarly, a fill factor is determined for bevel edge 352 by dividing the substrate area ($A_{(substrate)}$) within the rectangular frame 360 divided by the total area of the rectangular frame 360 ($A_{(frame)}$). Since bevel edge 302 of substrate 300 is less tapered than bevel edge 352 of substrate 350, the fill factor associated with bevel edge 302 of substrate 300 is greater than the fill factor associated with bevel edge 352 of substrate 350.

In this case, it is theorized that the greater degree of taper and the cone shape of bevel edge 352 of substrate 350 tend to allow more of the plasma etch agents of the surrounding donut-shaped plasma cloud to reach deeper toward the center of substrate 350. In contrast, the relative lack of taper and the more box-like shape of bevel edge 302 of substrate 300 tend to allow fewer of the plasma etch agents of the surrounding donut-shaped plasma cloud to reach toward the center of substrate 300. Accordingly, all other parameters being equal, the etch rate at location 354 on substrate 350 of FIG. 3B will tend to be faster than the etch rate at location 304 on substrate 300 of FIG. 3A. With knowledge of the fill factor, one or more compensation factors may be adjusted to improve tie etch rate at location 304 on substrate 300 and/or to reduce the etch rate at location 354 on substrate 350 to improve bevel etch repeatability between substrate 300 and substrate 350. Similarly, rather than adjusting the etch rates at locations 304 and 354 by adjusting process parameters, it is possible to adjust the process time to make the etch distance, defined as the length between the wafer apex and the radius on the wafer at which all deposited films clear, of wafers 300 and 350 more comparable.

Note that a side benefit of the image analysis is the determination of the thickness (e.g., $T_{(a)}$ and $T_{(b)}$) of each substrate's bevel edge. This thickness parameter may also be employed to ascertain secondary compensation factors (e.g., to electrode gap distance, RF power, etch time, etch chemistry, pressure, etc.) to further improve the bevel etch repeatability among substrates.

Figure 4A:
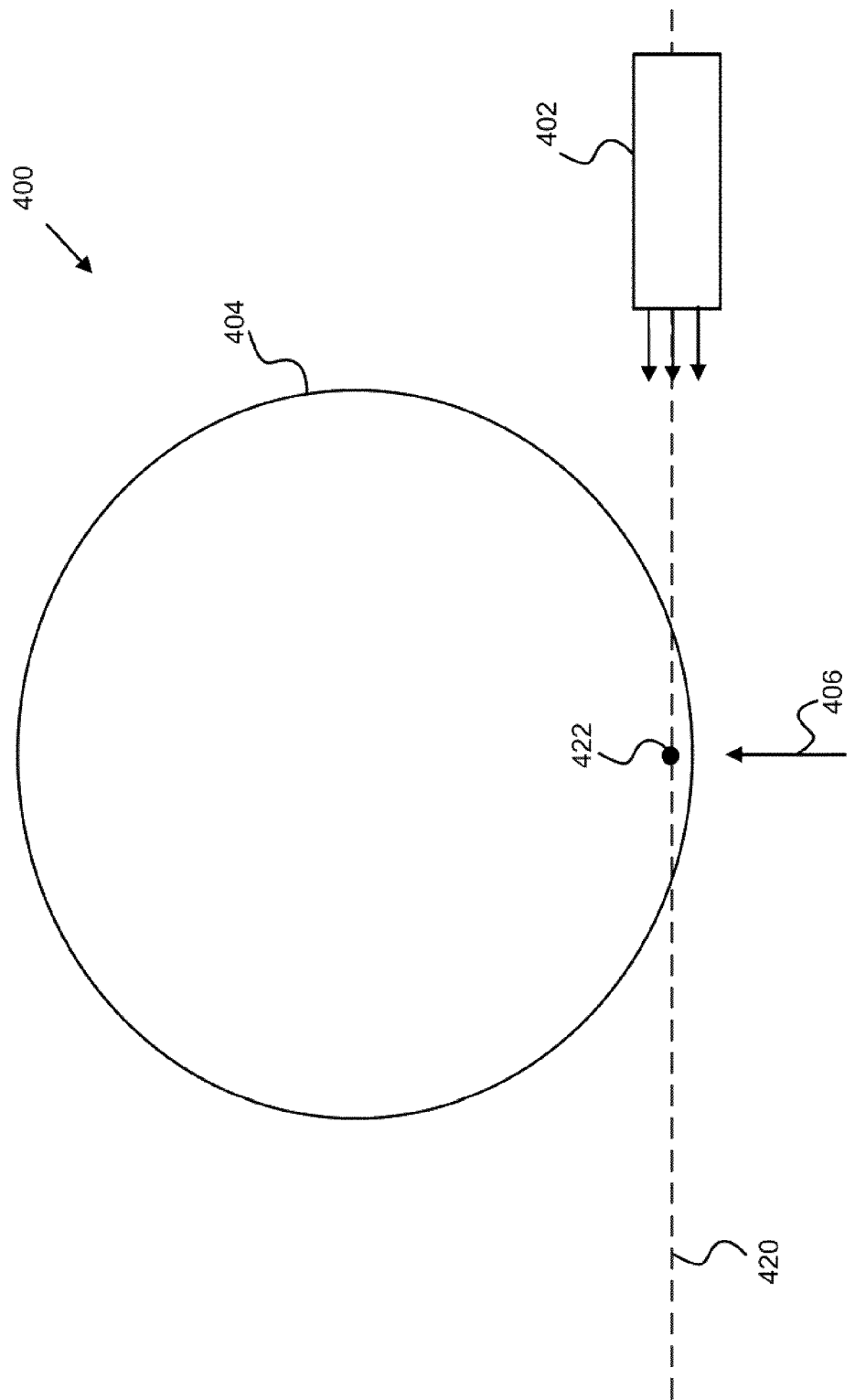
FIGS. 4A and 4B show, in accordance with an embodiment of the present invention, another bevel edge profile detection arrangement.
Figure 4B:
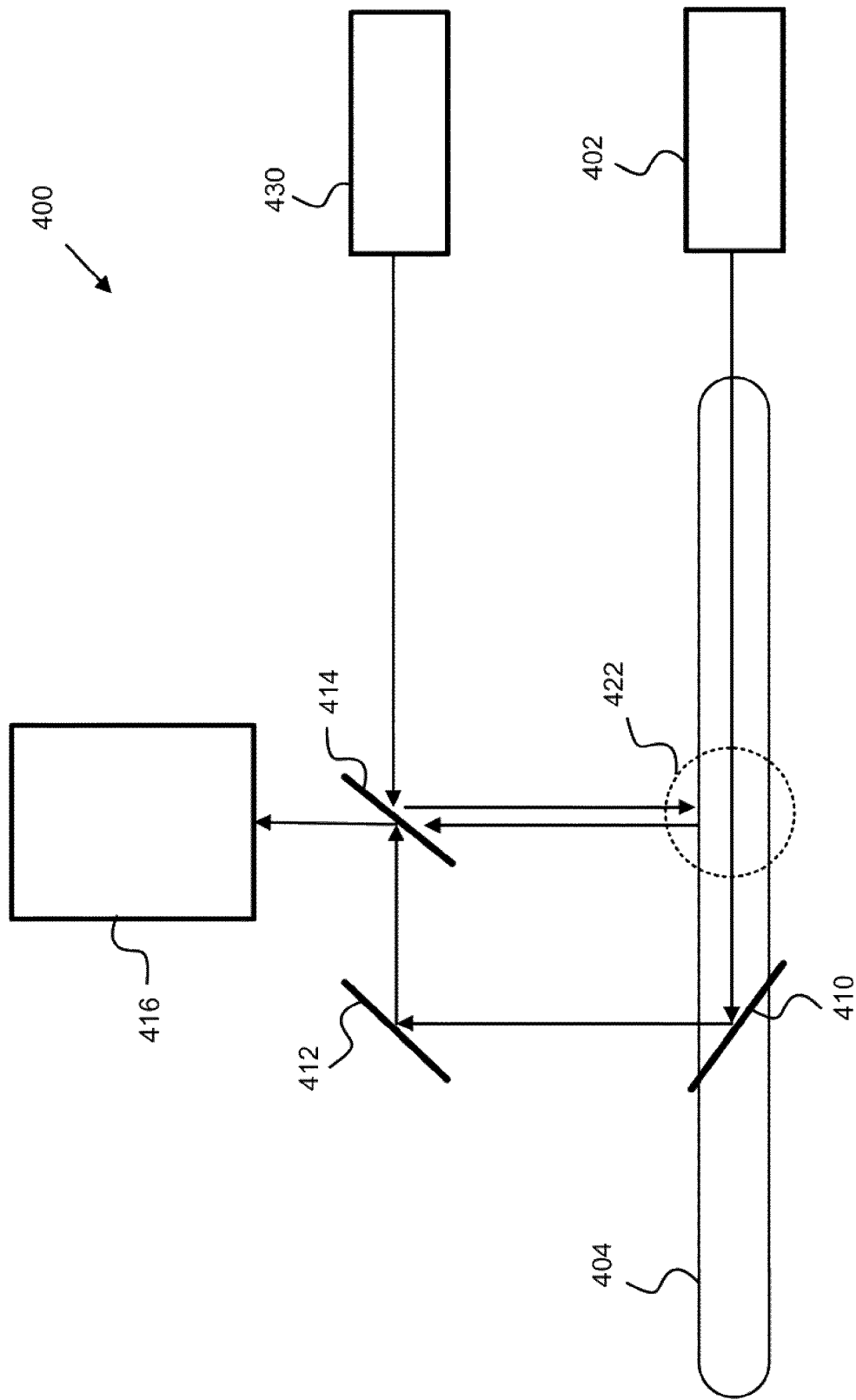

FIG. 4A and FIG. 4B show, in accordance with one or more embodiments of the invention, an arrangement 400 for obtaining the side profile image of a substrate bevel edge for the purpose of deriving compensation factors to improve bevel etch repeatability among substrates. FIG. 4A is an overhead view of arrangement 400 whereas FIG. 4B is a view directly at the bevel edge of the substrate of the same arrangement 400.

With reference to FIG. 4A, arrangement 400 is shown to include a light source 402 and a substrate 404. Mirror, camera, and additional light sources are omitted from FIG. 4A for ease of understanding but are shown clearly in FIG. 4B. An arrow 406 in FIG. 4A illustrates the viewing direction that results in the representation of FIG. 4B if the viewer's eye follows the direction of arrow 406 and looks toward the bevel edge of substrate 404.

With reference to FIG. 4B, the view now is toward the bevel edge of substrate 404, with substrate 404 oriented flat at eye level and out of the page. Light source 402 is again shown. Light source 402 illuminates the bevel edge of substrate 404 as can be seen in FIGS. 4A and 4B. Light source 402, mirror 410, mirror 412, mirror 414, camera 416 and measurement area 422 are in the same virtual plane (depicted by dashed line 420 in FIG. 4A).

Overhead camera 416 is positioned to receive light illumination from light source 402. Light from the illuminated bevel edge reflects off mirrors 410, 412, and mirror 414 to be received by camera 416. In this manner, a side profile image of the bevel edge of substrate 404 may be obtained. For this measurement, light source 430 is turned off.

Mirror 414 may be implemented by a semi-transparent mirror in one or more embodiments. In this case, camera 416 may also be used to inspect the top surface of the bevel edge and/or to obtain the bevel thickness. For example, a light source 430 may be employed to provide light to the top surface of the bevel edge (by reflecting off semi-transparent mirror 414). Camera 416 may then be employed to obtain the bevel thickness. For this measurement, light source 402 is turned off. Thus, depending on which of light sources 402 or 430 is on, camera 416 may be employed to obtain a side profile image of the bevel edge or to obtain information about the etch distance after the bevel etch is completed.

Once the image is acquired, analysis may proceed to derive the aforementioned compensation factors.

Figure 5:
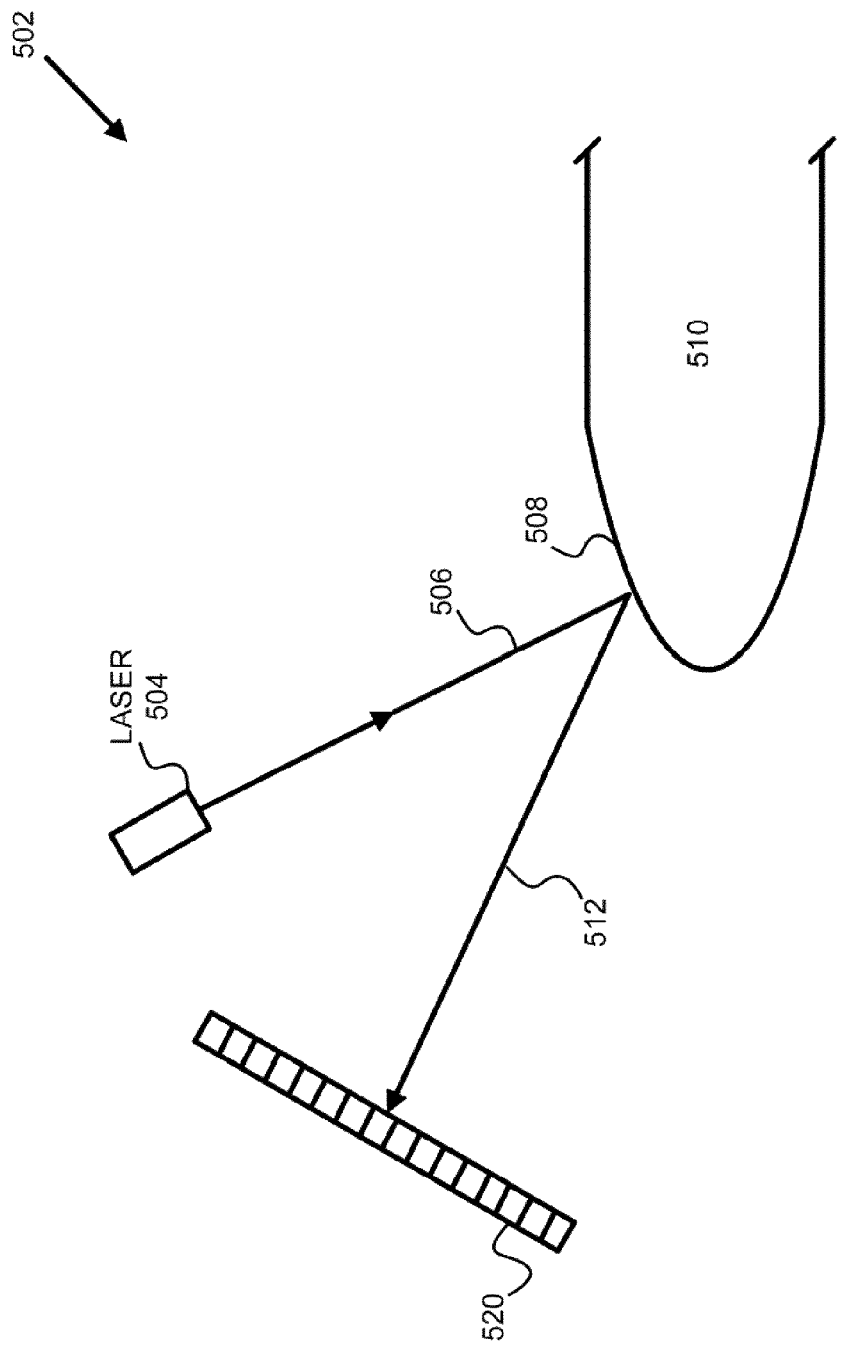
FIG. 5 shows, in accordance with an embodiment of the present invention, another bevel edge profile detection arrangement.

FIG. 5 shows, in accordance with one or more embodiments of the invention, an arrangement 502 for obtaining the side profile image of the substrate bevel edge for the purpose of deriving compensation factors to improve the bevel etch repeatability among substrates. A laser light source 504 is positioned to bounce a laser beam 506 off bevel edge 508 of substrate 510. The reflected beam 512 strikes one or more of the sensors in an array of sensors 520. The information regarding which sensor receives the reflected beam 512 as well as information regarding the relative positions of laser light source 504 and array of sensors 520 will furnish information regarding the degree of taper of bevel edge 508 of substrate 510. This information can then be employed to derive compensation factors to improve the bevel etch repeatability from substrate to substrate. If desired, multiple lasers having different wave lengths and/or polarizations may be employed with array of sensors 520. Further, the orientation and position of laser light source 504 and of array of sensors 520 are only illustrative and other positions and orientations are possible.

Figure 6:
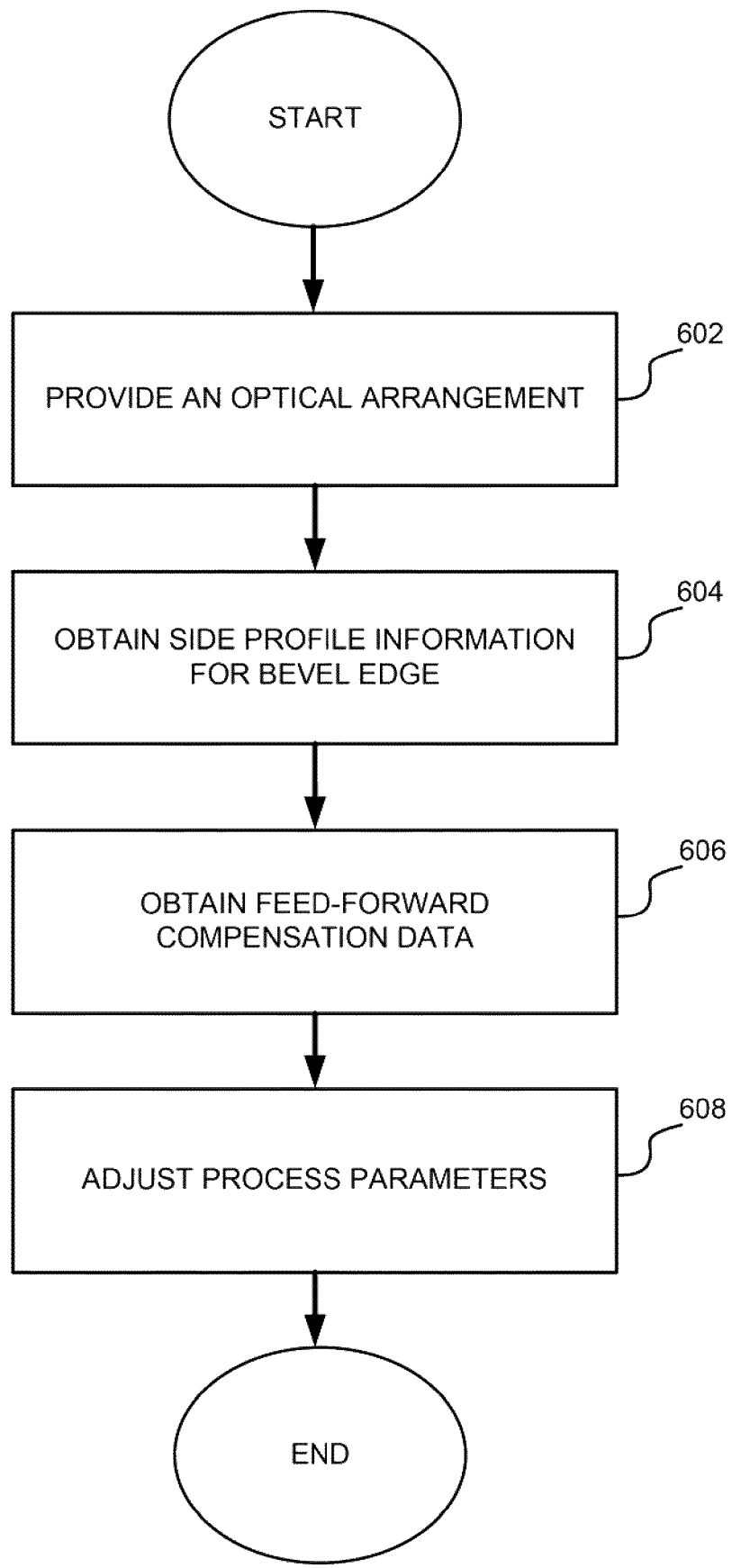
FIG. 6 shows, in accordance with an embodiment of the present invention, a method for improving bevel etch repeatability among substrates.

FIG. 6 shows, in accordance with one or more embodiments of the present invention, a method for acquiring the side profile information pertaining to the substrate bevel edge and for improving bevel etch repeatability from substrate to substrate. In step 602, an optical arrangement is provided. In step 604, the side profile information pertaining to the substrate bevel edge is obtained from the optical arrangement. In step 606, the side profile information is analyzed to generate feed-forward compensation data. In step 608, the feed-forward compensation data is employed to adjust process parameters in order to improve bevel etch repeatability among wafers.

As can be appreciated from the foregoing, embodiments of the invention provide methods and apparatus to ascertain the bevel shape and/or thickness of the substrate bevel edge to enable the calculation of feed-forward compensation factors. These compensation factors are then employed to adjust one or more of the bevel etch process parameters (e.g., bevel etch time, bevel etch chemistry, electrode gap, RF power level, pressure, etc.) to improve the bevel etch repeatability from substrate to substrate.

While this invention has been described in terms of several preferred embodiments, there are alterations, permutations, and equivalents, which fall within the scope of this invention. Although various examples are provided herein, it is intended that these examples be illustrative and not limiting with respect to the invention. For example, although the fill factor is discussed as one bevel edge characteristic to be ascertained for the purpose of computing the compensation factors, other characteristics such as bevel slope, shape, etc., may also be employed. As another example, although optical cameras and laser sensors are discussed as possible techniques for ascertaining the bevel edge characteristics for the purpose of computing the compensation factors, other techniques such as fringe counting may also be employed. Also, the title is provided herein for convenience and should not be used to construe the scope of the claims herein. If the term "set" is employed herein, such term is intended to have its commonly understood mathematical meaning to cover zero, one, or more than one member. It should also be noted that there are many alternative ways of implementing the methods and apparatuses of the present invention.

What is claimed is:

1. A method, performed in connection with bevel etching of a substrate, for improving bevel etch repeatability among substrates, said substrate including a bevel edge, the method comprising:

providing, using a first light source, first light in a direction parallel to a top surface of said substrate for illuminating said bevel edge;

obtaining a side profile image of said bevel edge during said illuminating said bevel edge;

ascertaining, using said side profile image of said bevel edge, at least one bevel edge characteristic of said bevel edge;

deriving at least one compensation factor from said at least one bevel edge characteristic, said at least one compensation factor pertaining to an adjustment in a bevel etch process parameter; and performing said bevel etching utilizing said at least one compensation factor.

2. The method of claim 1 wherein said obtaining includes using a camera disposed coplanar with said substrate and directed tangentially at said bevel edge to obtain said side profile image of said bevel edge, said bevel edge being disposed between said camera and said first light source.

3. The method of claim 2 wherein said at least one bevel edge characteristic is a fill-factor, the method further comprising dividing a substrate area in a rectangular frame associated with said side profile image of said bevel edge by a total area of said rectangular frame associated with said side profile image of said bevel edge to calculate said fill-factor.

4. The method of claim 1 wherein said bevel etch process parameter is one of a bevel etch time, bevel etch chemistry, inter-electrode gap, RF power, RF frequency and chamber pressure.

5. The method of claim 1 further comprising using one or more mirrors to reflect an illuminated side profile of said bevel edge, said one or more mirrors being separate from said substrate, wherein said obtaining includes using a camera disposed above said substrate to obtain a reflected side profile image of said illuminated side profile reflected by at least one of said one or more mirrors.

6. The method of claim 5 further comprising turning off a second light source during said obtaining.

7. The method of claim 5 wherein said one or more mirrors include at least three mirrors.

8. A method, performed in connection with bevel etching of a substrate, for improving bevel etch repeatability among substrates, said substrate including a bevel edge, the method comprising:

providing, using a first light source, first light in a direction parallel to a top surface of said substrate for illuminating said bevel edge;

obtaining a side profile image of said bevel edge during said illuminating said bevel edge, ascertaining, using said side profile image of said bevel edge, at least one bevel edge characteristic of said bevel edge, said at least one bevel edge characteristic including a bevel edge thickness that is measured at a predefined distance from an edge of said substrate;

deriving at least one compensation factor from said at least one bevel edge characteristic, said at least one compensation factor pertaining to an adjustment in a bevel etch process parameter; and performing said bevel etching utilizing said at least one compensation factor.

9. The method of claim 8 wherein said obtaining includes using a camera disposed coplanar with said substrate and directed tangentially at said bevel edge to obtain said side profile image of said bevel edge, said bevel edge being disposed between said camera and said first light source.

10. The method of claim 9 wherein said at least one bevel edge characteristic is a fill-factor, the method further comprising dividing a substrate area in a rectangular frame associated with said side profile image of said bevel edge by a total area of said rectangular frame associated with said side profile image of said bevel edge to calculate said fill-factor.

11. The method of claim 8 wherein said bevel etch process parameter is one of a bevel etch time, bevel etch chemistry, inter-electrode electrode gap, RF power, RF frequency and chamber pressure.

12. The method of claim 8 further comprising using one or more mirrors to reflect an illuminated side profile of said bevel edge, said one or more mirrors being separate from said substrate, wherein said obtaining includes using a camera disposed above said substrate to obtain a reflected side profile image of said illuminated side profile reflected by at least one of said one or more mirrors.

13. The method of claim 12 further comprising turning off a second light source during said obtaining.

14. The method of claim 5 further comprising:
turning off said first light source to turn off said first light;
providing, using a second light source, second light to a semi-transparent mirror, wherein said one or more mirrors include said semi-transparent mirror;
using said semi-transparent mirror to reflect said second light for illuminating a top surface of said bevel edge.

15. The method of claim 14 wherein said semi-transparent mirror is disposed between said camera and said bevel edge.

16. The method of claim 1 further comprising:
turning off said first light source to turn off said first light;
providing, using a second light source, second light to a semi-transparent mirror;
using said semi-transparent mirror to reflect said second light for illuminating a top surface of said bevel edge.

17. The method of claim 16 further comprising inspecting said top surface of said bevel edge using at least a camera disposed above said semi-transparent mirror, said semi-transparent mirror being disposed between said camera and said bevel edge.

18. The method of claim 16 further comprising obtaining an image of said top surface of said bevel edge using at least a camera disposed above said semi-transparent mirror, said semi-transparent mirror being disposed between said camera and said bevel edge.

19. The method of claim 16 further comprising determining an etch distance after etching said bevel edge, said determining includes using at least a camera disposed above said semi-transparent mirror, said semi-transparent mirror being disposed between said camera and said bevel edge.

20. The method of claim 16 wherein said second light is parallel to said top surface of said substrate.

* * * * *

UNITED STATES PATENT AND TRADEMARK OFFICE
CERTIFICATE OF CORRECTION

PATENT NO. : 7,977,123 B2  
APPLICATION NO. : 12/471297  
DATED : July 12, 2011  
INVENTOR(S) : Andreas Fisher, Neungho Shin and Francisco Camargo Page 1 of 1

It is certified that error appears in the above-identified patent and that said Letters Patent is hereby corrected as shown below:

On the Title page  
Item (75), 3rd named inventor: Camargo, Fransisco is incorrect. Please amend the 3rd named inventor to: Camargo, Francisco.

Signed and Sealed this  
Eighteenth Day of October, 2011

David J. Kappos  
*Director of the United States Patent and Trademark Office*